United States Patent [19]
Saito

[11] Patent Number: 5,888,337
[45] Date of Patent: Mar. 30, 1999

[54] ENDPOINT DETECTOR FOR PLASMA ETCHING

[75] Inventor: Susumu Saito, Kofu, Japan

[73] Assignee: Tokyo Electron Limited, Tokyo, Jordan

[21] Appl. No.: 649,324

[22] Filed: May 17, 1996

[30]     Foreign Application Priority Data

May 20, 1995  [JP]  Japan ................................. 7-145568

[51] Int. Cl.⁶ ....................................................... C23F 1/02
[52] U.S. Cl. ......................................................... 156/345
[58] Field of Search ..................... 156/345; 204/298.32, 204/192.33; 356/356, 349, 363; 438/9

[56]            References Cited

U.S. PATENT DOCUMENTS 5,320,704  6/1994  Horioka et al. ......................... 156/626
5,405,488  4/1995  Dimitrelis et al. ...................... 156/627
5,414,504  5/1995  Litvak et al. .

*Primary Examiner*—Lynette F. Smith
*Assistant Examiner*—Brenda G. Brumback
*Attorney, Agent, or Firm*—Oblon, Spivak, McClelland, Maier & Neustadt, P.C.

[57]            ABSTRACT

An endpoint detector for plasma etching comprises a photo detecting section for receiving an emission spectrum of plasma due to etching gas from a process chamber for providing plasma etching to a processing object so as to detect a specific waveform of the received emission spectrum, a calculating section for detecting an endpoint of an etching process based on a detecting signal sent from the photo detecting means, the photo detecting section comprises a first optical system for detecting light having a specific wavelength from the emission spectrum received from the process chamber so as to be photoelectrically transferred, and a second optical system for detecting a part of the emission spectrum so as to be photoelectrically transferred before light having a specific wavelength is extracted from the emission spectrum by the first optical system, and the calculating section reduces drift of an electrical signal, which is based on light having a specific wavelength extracted from the first optical system, based on an electrical signal, which is based on light extracted from the second optical system, so as to detect the endpoint of the etching process.

5 Claims, 2 Drawing Sheets

ENDPOINT DETECTOR FOR PLASMA ETCHING

BACKGROUND OF THE INVENTION

1. Field of the Invention

The present invention relates to a detector detecting an advance state of a plasma etching process, particularly an endpoint of the plasma etching process.

2. Description of the Related Art

Generally, as shown in FIG. 3, a plasma etching device comprises a vacuum process chamber 1, serving as an etching chamber, and a pair of parallel plate electrodes 2 and 3, which are provided in upper and lower portions of the vacuum chamber 1 to have a predetermined distance. A gas introducing tube 4 and and a gas discharging tube 5 are connected to the vacuum process chamber 1. The gas introducing tube 4 is used to introduce CF series etching gas such as $CF_4$ into the vacuum chamber 1. The gas discharging tube 5 is used to discharge gas generated in the vacuum chamber 1 to an outer unit of the vacuum chamber 1. Among the pair of electrodes 2 and 3 provided in the vacuum chamber 1, the lower electrode 2 is formed on a bottom surface of the vacuum chamber 1 to be used as a base for mounting a processing object, such as a semiconductor wafer W. The lower electrode 2 is a ground electrode, and the upper electrode 3 is connected to a high frequency power source 6. Due to this, if a high frequency voltage is applied to the upper electrode 3 to be discharged between the upper and lower electrode 3 and 2, plasma P due to etching gas, which is introduce to the vacuum process chamber 1, is generated, and, for example, the semiconductor wafer W, which is mounted on the lower electrode 2, is etched by the activated species of etching gas, which is present in plasma P.

In order to realize the improvement of etching accuracy and automatic etching, an emission spectrum of plasma P due to etching gas is guided to an endpoint detector A for detecting an endpoint of a plasma etching process through a view window 1a formed in the vacuum process chamber 1. The endpoint detector A comprises a photo detector 7 and a calculating section 8. The photo detector 7 sequentially detects the emission spectrum of the plasma P emitted from the view window 1a of the vacuum process chamber 1 to be photoelectrically transferred. The calculating section 8 calculates an advance state of the etching based on a detection signal of the photo detector 7. An electrical signal sent from the calculating section 8 is sent to a controller 9, and the controller 9 controls the drive of the high frequency power source 6 based on the electrical signal sent from the calculating section 8. According to the above-mentioned structure, the etching process, which is suitable for a predetermined pattern, is provided to a surface of the semiconductor wafer W until the endpoint of the etching is detected by the endpoint detector A.

As shown in FIG. 4, the photo detector 7 comprises an optical system, which comprises an aberration corrected lens 71, an incident slit 72, a diaphragm 73, a concave surface diffraction grating 75, a first light-receiving sensor 79, and a second light-receiving sensor 82. The aberration corrected lens 71 converges the emission spectrum of the plasma P emitted from the view window 1a of the vacuum process chamber 1. The incident slit 72 is provided at a focal point of the aberration corrected lens 71. The diaphragm 73 reduces the emission spectrum passed through the incident slit 72. The concave surface diffraction grating 75 receives the emission spectrum sent from the diaphragm 73 through a reflection mirror 74. The first light-receiving sensor 79 comprises a photodiode for receiving a first-order diffracted light having a specific wavelength sent from the concave-surface diffraction grating 75 through reflection mirrors 76, 77 and an emission slit 78 so as to be photoelectrically transferred. The second light-receiving sensor 82 comprises a photodiode for receiving a zero-order diffracted light sent from the concave surface diffraction grating 75 through a reflection mirror 80 and an interference filter 81 so as to be photoelectrically transferred.

According to the above-mentioned optical system, the photo detector 7 can detect a specific wavelength of the emission spectrum of plasma P. Generally, the wavelength to be detected by the photo detector 7 is determined by kinds of etching gas. In a case where a silicon oxide film is etched by use of etching gas of CF series such as a $CF_4$, a specific wavelength of the emission spectrum of an activated species CO* which is a reaction product, such as 219 nm or 483.5 nm is detected by the photo detector 7. Also, In a case where a silicon nitride film is etched by use of etching gas of CF series such as a $CF_4$, a specific wavelength of the emission spectrum of an activated species N* which is a reaction product, such as 674 nm is detected by the photo detector 7.

More specifically, in the case where a silicon oxide film is etched, an light-receiving angle of the concave-surface diffraction grating 75 is set to have a predetermined angle in order that the first-order diffracted light whose wavelength is, for example, 219 nm is guided to the first light-receiving sensor 79 from the concave-surface diffraction grating 75 through the reflection mirrors 76, 77 and the emission slit 78. At the same time, in order to that the zero-order diffracted light from the concave-surface diffraction grating 75 having the above-set light-receiving angle incident onto the second light-receiving sensor 82, in other words, light, which changes in accordance with density of the emission spectrum of the vacuum process chamber 1, is made incident onto the second light-receiving sensor 82, the optical system, which comprises the reflection mirror 80, the interference filter 81 and the second light-receiving sensor 82, is set to have a predetermined light-receiving angle. Then, in the wavelength detection under the above-mentioned state, the calculating section 8 corrects an electrical signal $s_1$, which is based on the first-order diffracted light, sent from the first light receiving sensor 79, by an electrical signal $s_2$, which is based on the zero-order diffracted light, sent from the second light receiving sensor 82 to smooth a drift phenomenon of light having the specific wavelength, which is to be detected, thereby the change of light having the specific wavelength is correctly captured, and the endpoint of etching is correctly calculated.

In the above-structured endpoint detector A, if the object to be etched is changed from the silicon oxide film to the silicon nitride film, the specific wavelength of the first-order diffracted light to be extracted through the concave-surface diffraction grating 75 is changed from 219 nm to 674 nm. Due to this, it is needed that the concave-surface diffraction grating 75 be rotated to change the light-receiving angle. However, in the optical system of the above-mentioned conventional endpoint detector A, the zero-order diffracted light sent from the concave-surface diffraction grating 75 is detected in order to smooth the drift phenomenon of light having the specific wavelength which is to be detected. Due to this, if the light-receiving angle of the concave-surface diffraction grating 75 is changed, an optical path of the zero-order diffracted light is varied. Due to this, there must be also changed the light-receiving angle of the optical system including the reflection mirror 80 for capturing the zero-order diffracted light from the concave-surface diffraction grating 75, the interference filter 81, and the second light-receiving sensor 82. Due to this, there is a problem in that the adjusting operation is extremely complicated.

SUMMARY OF THE INVENTION

An object of the present invention is to provide an endpoint detector of plasma etching wherein an optical system for extracting first-order diffracted light is only adjusted even if a detecting object of an emission spectrum of plasma is varied and the adjustment of the optical system is simple.

The above object can be achieved by the following endpoint detector. More specifically, according to the present invention, there is provided an endpoint detector comprising photo detecting means for receiving an emission spectrum of plasma due to etching gas from a process chamber for providing plasma etching to a processing object so as to detect a specific waveform of the received emission spectrum; calculating means for detecting an endpoint of an etching process based on a detecting signal sent from the photo detecting means, wherein the photo detecting means comprises a first optical system for detecting light having a specific wavelength from the emission spectrum received from the process chamber to be photoelectrically transferred, and a second optical system for detecting a part of the emission spectrum so as to be photoelectrically transferred before light having a specific wavelength is extracted from the emission spectrum by the first optical system, and the calculating means for reducing drift of an electrical signal, which is based on light having a specific wavelength extracted from the first optical system, based on an electrical signal, which is based on light extracted from the second optical system, so as to detect the endpoint of the etching process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

DETAILED DESCRIPTION OF THE PREFERRED EMBODIMENT

An embodiment of the present invention will be explained with reference to FIGS. 1 and 2.

Figure 1:
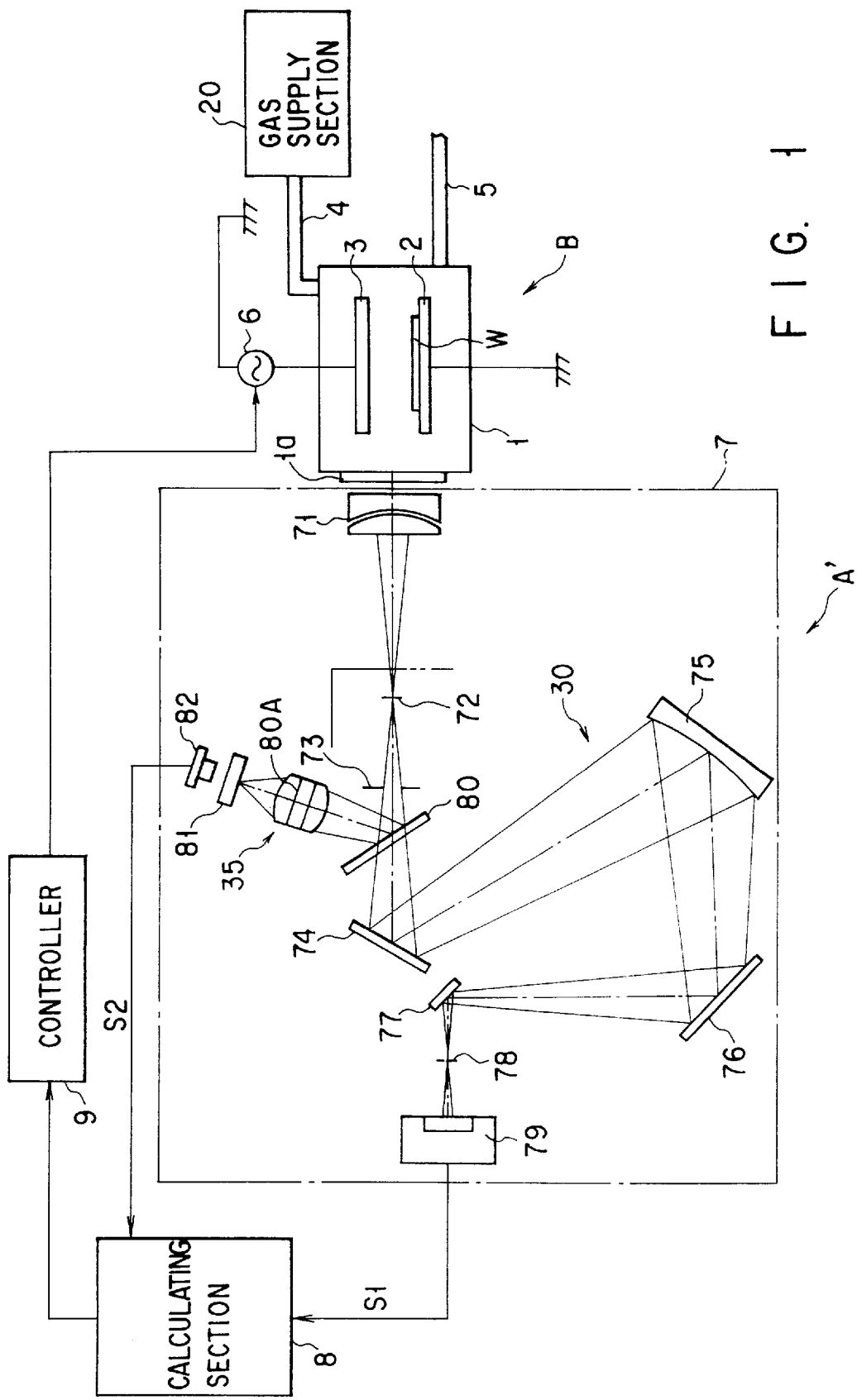
FIG. 1 is a structural view of a system comprising an endpoint detector of an embodiment of the present invention, and a plasma etching device.

FIG. 1 shows a plasma etching device B and an endpoint detector A' for detecting an endpoint of an etching process, which is processed by the plasma etching device B. As shown in the figure, the plasma etching device B comprises a vacuum process chamber 1, which is formed of conductive material such as aluminum, and a pair of parallel plate electrodes 2 and 3, which are provided in upper and lower portions of the vacuum chamber 1 to have a predetermined distance. A gas introducing tube 4 and a gas discharging tube 5 are connected to the vacuum process chamber 1. The gas introducing tube 4 is used to introduce CF series etching gas such as $CF_4$ into the vacuum chamber 1 from an etching gas supply section 20. The gas discharging tube 5 is used to discharge gas generated in the vacuum chamber 1 to an outer unit of the vacuum chamber 1. Among the pair of parallel electrodes 2 and 3 provided in the vacuum chamber 1, the lower electrode 2 is formed on a bottom surface of the vacuum chamber 1 to be used as a base for mounting a processing object, such as a semiconductor wafer W. The lower electrode 2 is a ground electrode, and the upper electrode 3 is connected to a high frequency power source 6. Due to this, if a high frequency voltage is applied to the upper electrode 3 to be discharged between the upper and lower electrode 3 and 2 from the high frequency power source 6, etching gas introduced to the vacuum process chamber 1 is activated, plasma P, which is formed of an activated species such as an radical species, an ion species, etc. is generated, and, for example, the semiconductor wafer W, which is mounted on the lower electrode 2, is etched by the activated species.

A thin and long view window 1a, which is extended in a horizontal direction, is attached to a part of a peripheral surface of the vacuum process chamber 1. The view window 1a is formed of a transparent material such as quartz glass, and can transmit the emission spectrum of plasma P, which is generated in the vacuum process chamber 1, therethrough. In order to detect an advance state of the etching process of the semiconductor wafer W, the emission spectrum of plasma P, which is passed through the view window 1a, is guided to the endpoint detector A' for detecting the endpoint of the plasma etching.

The endpoint detector A' comprises a photo detector 7 and a calculating section 8. The photo detector 7 sequentially detects the emission spectrum of the plasma P emitted from the view window 1a of the vacuum process chamber 1 to be photoelectrically transferred. The calculating section 8 calculates an advance state of the etching based on a detection signal of the photo detector 7. An electrical signal sent from the calculating section 8 is sent to a controller 9, and the controller 9 controls the drive of the high frequency power source 6 based on the electrical signal sent from the calculating section 8. According to the above-mentioned structure, the etching process, which is suitable for a predetermined pattern, is provided to a surface of the semiconductor wafer W until the endpoint of the etching is detected by the endpoint detector A'.

The photo detector 7 comprises an aberration corrected lens 71 for converging the emission spectrum of the plasma P emitted from the view window 1a of the vacuum process chamber 1, an incident slit 72, which is provided at a focal point of the aberration corrected lens 71, and a diaphragm 73 for reducing the emission spectrum passed through the incident slit 72. Moreover, the photo detector 7 comprises a first optical system 30, which comprises a reflection mirror 74 for reflecting the emission spectrum sent from the diaphragm 73, a concave-surface diffraction grating 75 for receiving a reflected light sent from the reflection mirror 74, and a first light-receiving sensor 79 for receiving a first-order diffracted light having a specific wavelength sent from the concave surface diffraction grating 75 through reflection mirrors 76, 77 and an emission slit 78 so as to be photoelectrically transferred. In order that the first-order diffracted light sent from the concave-surface diffraction grating 75 is amplified to largely capture the change of an activated species, which is a reaction product in etching (CO* in a case of etching a silicon oxide film), the first light-receiving sensor 79 comprises a multiplier photo tube, which photoelectrically amplifies the received light. The concave-surface diffraction grating 75 is formed such that the light-receiving angle can be changed. Due to this, when the light-receiving angle of the grating 75 is set to be a predetermined angle, the first-order diffraction light having a specific wavelength can be emitted to the first light-receiving sensor 79 through the reflection mirrors 76 and 77 and the emission slit 78.

The photo detector 7 comprises a second optical system 35 for obtaining a part of the emission spectrum before the emission spectrum sent from the slit 72 is diffracted by the concave-surface diffraction grating 75. The second optical system 35 is formed to be optically independent of the first optical system 30. The second optical system 35 comprises a half mirror 80, which is provided in an optical path formed between the diaphragm 73 and the reflection mirror 74, and a condenser lens 80A, an interference filter 81, and a second light-receiving sensor 82. The emission spectrum, which is obtained by being reflected by the half-mirror 80, is converged by the condenser lens 80A. Also, the emission spectrum is passed through the interference filter 81, which obtains a waveband where the emission spectrum of the plasma P of CF series gas such as $CF_4$ concentrates, so as to be incident onto the second light-receiving sensor 82, which comprises a photodiode, to be photoelectrically transferred. The optical element, which is to be provided in the optical path formed between the diaphragm 73 and the reflection mirror 74, is not limited to the half-mirror 80. If the element has a function of obtaining a part of the emission spectrum, for example, a hole mirror having a hole at its center can be used.

Figure 2:
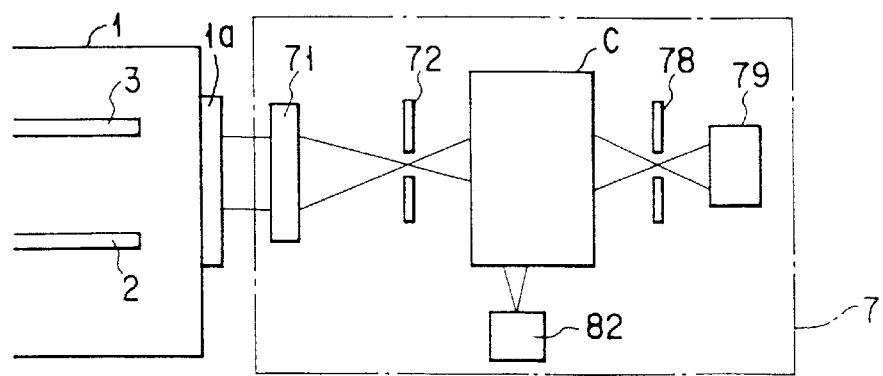
FIG. 2 is a schematically expanded view showing a relationship between an incident slit and an emission slit of the endpoint detector of FIG. 1.
Figure 3:
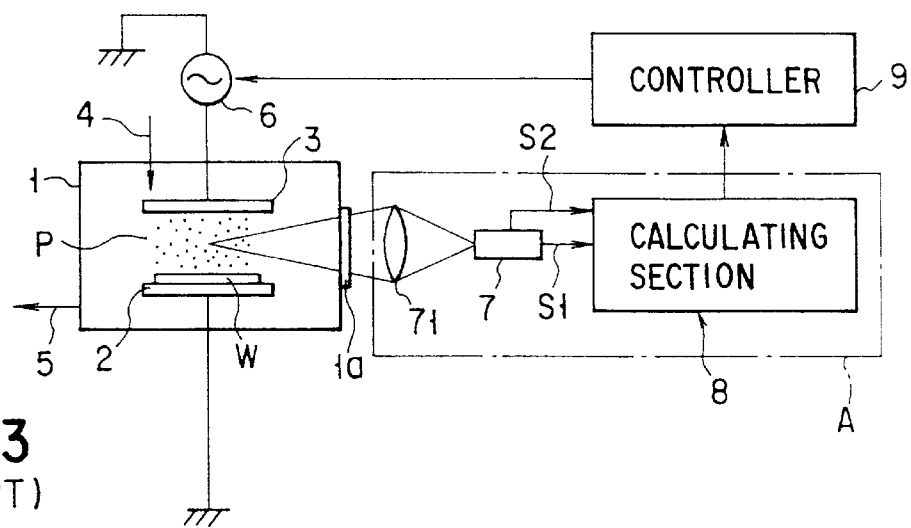
FIG. 3 is a structural view of a system comprising a conventional endpoint detector and a plasma etching device.
Figure 4:
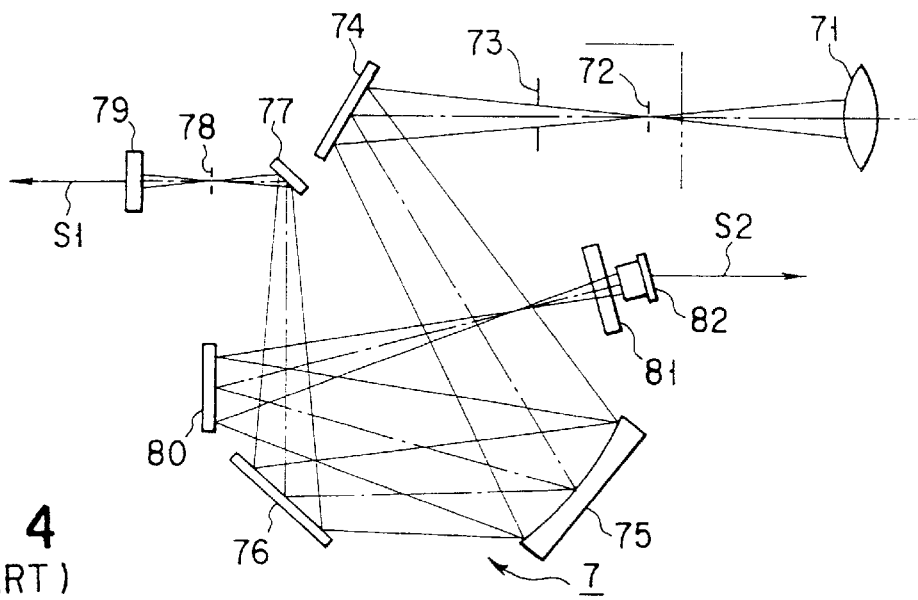
FIG. 4 is a view showing an optical system of the endpoint detector of FIG. 3.

As shown in FIG. 1 and FIG. 2, which schematically shows the optical system, the incident slit 72 is positioned in a space, which is sandwiched between a plane including the electrode 2 and a plane including the electrode 3. Moreover, the slit direction is positioned to be parallel to the parallel plate electrodes 2 and 3 of the vacuum process chamber 1. Preferably, a central axis of the slit is positioned to be passed through the center of the space between the electrodes 2 and 3. On the other hand, the direction of the emission slit 78 is positioned to be parallel to the parallel plate electrodes 2 and 3 of the vacuum process chamber 1. By the above-mentioned arrangement of the incident slit 72 and the emission slit 78, the first-order diffracted light, which is sent from the concave-surface grating 75, can be efficiently and surely made incident onto the first light-receiving sensor 79 to have substantially the same intensity as the emission spectrum generated between the electrodes 2 and 3. Also, light, which has substantially the same intensity as the emission spectrum generated between the electrodes 2 and 3, can be made incident onto the half-mirror 80. Thereby, light, which changes in accordance with intensity of the emission spectrum of the vacuum process chamber 1, can be accurately made incident onto the second light-receiving sensor 82. It is noted that a block, which is shown by C of FIG. 2, includes all optical elements excepting the optical elements 71, 72, 78, 79, and 82.

The following will explain a case where the endpoint of the etching process of the silicon oxide film due to the plasma etching device B is detected by the above-structured endpoint detector A'.

After atmosphere of the vacuum process chamber 1 is set to be a vacuum state of, for example, 0.1 mTorr to several mTorr, the semiconductor wafer W having the silicon oxide film formed is mounted on the lower electrode 2 of the vacuum process chamber 1. Next, the high frequency voltage is applied to the upper electrode 3 by the high frequency power source 6 as etching gas containing, for example, $CF_4$ gas is supplying to the vacuum process chamber 1 from the gas supply section 20 through the gas introducing tube 4. Thereby, a vacuum discharging occurs between the electrodes 2 and 3 in a state $CF_4$, etc., is used as a medium, plasma P caused by $CF_4$ is generated and the silicon oxide film is etched by the activated species in the plasma P, and an emission spectrum caused by $CF_4$ is generated. In this case, CO, which is generated when the silicon oxide film is etched by the activated species generated from $CF_4$, is excited by discharging energy to become CO*. The above-generated emission spectrum includes spectrum beam, which is generated when the activated species CO* returns to the ground state.

The emission spectrum is emitted from the view window 1a of the vacuum process chamber 1, and sequentially made incident onto the aberration corrected lens 71 of the photo detector 7 of the endpoint detector A' to be converged to the incident slit 72. In this case, since the aberration corrected lens 71 is used as a converging lens, the emission spectrum, which is made incident onto the photo detector 7, is well image-formed accurately on the focal point by the aberration corrected lens 71. In the photo detector 7, for etching the silicon oxide film, the light-receiving angle of the concave-surface diffraction grating 75 is set to be a predetermined angle in order that the first-order diffracted light having a wavelength of 219 nm is guided to the first light-receiving sensor 79 from the concave-surface diffraction grating 75 through the reflection mirror 76, 77 and the emission slit 78. Therefore, if the emission spectrum, which is converged at the incident slit 72, is made incident onto the concave-surface diffraction grating 75 through the diaphragm 73, the half-mirror 80, and the reflection mirror 74, the first-order diffracted light having wavelength of 219 nm of CO* is guided to the first light-emitting sensor 79 from the concave-surface grating 75 through the reflection mirror 76, 77, and the emission slit 78. The first light-emitting sensor 79 amplifies a photoelectricity, which is generated based on the light-receiving, to be photoelectrically transferred, and transmits an electrical signal $s_1$, which is suitable for intensity of first-order diffracted light, to the calculating section 8.

On the other hand, the part of the emission spectrum, which is converged at the incident slit 72, is guided to the condenser lens 80A by the half-mirror 80. Then, only the spectrum light of a predetermined waveband is extracted by the interference filter 81 to be made incident onto the second light-emitting sensor 82. The second light-emitting sensor 82 photoelectrically transfers the received light, and transmits an electrical signal $S_2$, which is suitable for intensity of the received light, to the calculating section 8.

At the time of the end of etching, intensity of the first-order diffracted light received by the first light-receiving sensor 79 is decreased together with the decrease in an amount of generation CO*. Contrarily, CF series gas increases, and intensity of the emission spectrum, which is caused by the CF series gas, increases. Due to this, intensity of light, which is received by the second light-receiving sensor 82, becomes large. In this case, intensity of the first-order diffracted light, which is received by the first light-receiving sensor 79, brings about the drift, which is caused by plasma P. Due to this, the calculating section 8 removes the drift of the electrical signal $S_1$, which is extracted from the first light-receiving sensor 79, by use of the electrical signal $s_2$, which is extracted from the second light-receiving sensor 82. Thereby, the electrical signal $s_1$ is smoothed, and the endpoint of etching is correctly calculated. Thereafter, the calculating section 8 transmits the signal, which is based on the result of the calculation, to the controller 9, and the controller 9 correctly controls the drive of the high frequency power source 6 based on the signal sent from the calculating section 8. By the above-mentioned structure, the etching process, which is suitable for a predetermined pattern, is provided to a surface of the semiconductor wafer W until the endpoint of etching is detected by the endpoint detector A'.

The above explained the case in which the etching object is the silicon oxide film. In a case where the etching object is changed from the silicon oxide film to, for example, the silicon nitride film, the first-order diffracted light to be obtained through the concave-surface grating 75 is changed from 219 nm to 674 nm. Due to this, it is needed that the concave-surface grating 75 be rotated to change the light-receiving angle. However, the second optical means 35 including the half-mirror 80b is formed to be optically independent of the first optical means 30. Then, before the emission spectrum is diffracted by the concave-surface grating 75, the part of the emission spectrum is received by the second optical means 35. Due to this, there is no need that the light-receiving angle of the second optical means 35 including the half mirror 80 be changed in accordance with the change of the light-receiving angle of the concave-surface grating 75.

As explained above, in the endpoint detector A' of this embodiment, the second optical means 35, which extracts a predetermined waveband of the emission spectrum of the activated species of all generating gas generated by etching, is provided to be optically independent of the first optical means 30, which extracts the emission spectrum of the activated species, using as an index for showing the advance state of etching, as first-order diffraction light. Then, before the emission spectrum is diffracted by the first optical means 30, the part of the emission spectrum is extracted by the second optical means 35. In other words, zero-order diffracted light from the concave-surface diffraction grating 75 is not detected to smooth the drift phenomenon of light having the specific wavelength to be detected. Due to this, even if the etching object is changed and the detecting object of the emission spectrum of plasma is varied, only the first optical system 30 (concave-surface diffraction grating 75) is adjusted. Unlike the conventional apparatus, there is no need that the second optical system including the half-mirror 80 is adjusted to the first optical system 30. Therefore, the adjustment of the optical system is extremely simple in the variation of the etching object, and such a structure is extremely useful for operating.

Moreover, in the endpoint detector A' of this embodiment, since the aberration corrected lens 71 is used as a condenser (converging) lens, light can be image-formed on the focal point accurately by the aberration corrected lens 71.

Furthermore, in the endpoint detector A' of this embodiment, the incident slit 72 is positioned in the space, which is sandwiched between the plane including the electrode 2 and the plane including the electrode 3. The slit direction is positioned to be parallel to the parallel plate electrodes 2 and 3 of the vacuum process chamber 1. Preferably, the central axis of the slit is positioned to be passed through the center of the space between the electrodes 2 and 3. On the other hand, the direction of the emission slit 78 is positioned to be parallel to the parallel plate electrodes 2 and 3 of the vacuum process chamber 1. Therefore, the entire emission spectrum generated between the electrodes 2 and 3 can be efficiently converged through the aberration corrected lens 71. Then, the first-order diffracted light, which is sent from the concave-surface diffraction grating 75, can be efficiently and surely made incident onto the first light-receiving sensor 79 to have substantially the same intensity as the emission spectrum generated between the electrodes 2 and 3. Also, light, which has substantially the same intensity as the emission spectrum generated between the electrodes 2 and 3, can be made incident onto the half-mirror 80. Thereby, light, which changes in accordance with intensity of the emission spectrum in the vacuum process chamber 1, can be accurately made incident onto the second light-receiving sensor 82. In other words, the optical signals, which are received by the concave-surface diffraction grating 75 and the half mirror 80, are detected as signals sent from substantially the same light source, and the light-receiving of the emission spectrum can be achieved with high accuracy.

Moreover, in the endpoint detector A' of this embodiment, the focal distance of the aberration corrected lens 71 is set be long as possible in order not to exert influence of the interference wave of the emission spectrum, which is reflected from the etching object, on the endpoint detector A'. Due to this, noise of the electrical signals $s_1$ and $s_2$, which are transmitted from the first and second light-receiving sensors 79 and 82, is extremely small. Therefore, the advance state of etching can be correctly checked, and the endpoint of etching can be surely detected.

The present invention is not limited to the above-mentioned embodiment. Particularly, regarding the first and second optical means 30 and 35, it is needless to say that the optical elements can be suitably changed in accordance with the kinds of the plasma etching device in the range where the above-mentioned function is exerted.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An plasma etching endpoint detector, for detecting an endpoint of a plasma etching process, said endpoint detector coupled to a process chamber which provides etching plasma to a processing object via a pair of parallel plate electrodes, said endpoint detector comprising:

photo detecting means for receiving an emission spectrum of said plasma, and for transmitting first and second detecting signals based on said received emission spectrum;

calculating means, coupled to said photo detecting means, for detecting said endpoint of said etching process based on said first and second detecting signals received from said photo detecting means;

wherein said photo detecting means comprises;

a first optical system, coupled to said calculating means, for detecting first-order diffracted light having a specific wavelength from the emission spectrum, for photoelectrically transferring said detected light, and for transmitting said first detecting signal, said first optical system, including,
a condenser lens for converging the emission spectrum,
an incident slit provided at a focal position of said condenser lens,
a diffraction grating for receiving said emission spectrum passed through said incident slit, and for diffracting said first-order diffracted light, wherein a light-receiving angle of said diffraction grating is variable,
an emission slit provided after said diffraction grating for receiving said first-order diffracted light, and
a first light-receiving sensor for receiving the first-order diffracted light from said diffraction grating passing through said emission slit, and for transmitting said first detecting signal, and
a second optical system for detecting a predetermined wave band of the emission spectrum, for photoelectrically transferring said detected part of the emission spectrum, and for transmitting said second detecting signal, said second optical system, including,
dispersing means, provided in an optical path formed between said incident slit and said diffraction grating, for extracting a part of the emission spectrum passing through said incident slit, and
a second light-receiving sensor for receiving the part of emission spectrum extracted by said dispersing means, and for transmitting said second detecting signal; and
wherein said calculating means reduces drift in said first detecting signal received from the first optical system based on said second detecting signal received from said second optical system, to detect the endpoint of the etching process.

2. The endpoint detector according to claim 1, wherein said condenser lens comprises an aberration corrected lens.

3. The endpoint detector according to claim 1, wherein a slit direction of said incident slit and that of said emission slit are provided to be parallel to said pair of parallel plate electrodes.

4. The endpoint detector according to claim 3, wherein said incident slit is positioned between a plane including one parallel plate electrode of said pair of parallel plate electrodes and a plane including the other electrode of said pair of parallel plate electrodes.

5. A plasma etching device, for a plasma etching process of a processing object, comprising:
a process chamber for providing a plasma etching process to said processing object;
gas introducing means coupled to said process chamber for introducing etching gas to said process chamber;
a pair of electrodes provided in said process chamber for generating plasma due to etching gas in said process chamber;
a high frequency power source for applying a high frequency voltage to said pair of electrodes;
photo detecting means optically coupled to said process chamber for receiving an emission spectrum of said plasma, and for transmitting first and second detecting signals based on said received emission spectrum;
calculating means, coupled to said photo detecting means, for detecting an endpoint of said etching process based on said first and second detecting signals received from said photo detecting means, and for transmitting a calculation signal; and
control means coupled between said calculating means and said high frequency power source for controlling a drive of said high frequency power source based on said calculation signal received from said calculating means;
wherein said photo detecting means comprises:
a first optical system, coupled to said calculating means, for detecting first-order diffracted light having a specific wavelength from the emission spectrum, for photoelectrically transferring said detected light, and for transmitting said first detecting signal, said first optical system, including,
a condenser lens for converging the emission spectrum,
an incident slit provided at a focal position of said condenser lens,
a diffraction grating for receiving said emission spectrum passed through said incident slit, and for diffracting said first-order diffracted light, wherein a light-receiving angle of said diffraction grating is variable,
an emission slit provided after said diffraction grating for receiving said first-order diffracted light, and
a first light-receiving sensor for receiving the first-order diffracted light from said diffraction grating passing through said emission slit, and for transmitting said first detecting signal, and
a second optical system for detecting a predetermined wave band of the emission spectrum, for photoelectrically transferring said detected part of the emission spectrum, and for transmitting said second detecting signal, said second optical system, including,
dispersing means, provided in an optical path formed between said incident slit and said diffraction grating, for extracting a part of the emission spectrum passing through said incident slit, and
a second light-receiving sensor for receiving the part of emission spectrum extracted by said dispersing means, and for transmitting said second detecting signals; and
wherein said calculating means reduces drift in said first detecting signal received from the first optical system based on said second detecting signal received from said second optical system, to detect the endpoint of the etching process.

* * * * *